(12) United States Patent
Chu et al.

(10) Patent No.: US 6,489,551 B2
(45) Date of Patent: *Dec. 3, 2002

(54) ELECTRONIC MODULE WITH INTEGRATED THERMOELECTRIC COOLING ASSEMBLY

(75) Inventors: Richard C. Chu, Poughkeepsie, NY (US); Michael J. Ellsworth, Jr., Lagrangeville, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/726,900

(22) Filed: Nov. 30, 2000

(65) Prior Publication Data

US 2002/0062855 A1 May 30, 2002

(51) Int. Cl.$^7$ ............................................. H01L 35/02
(52) U.S. Cl. .................. 136/230; 136/230; 136/242; 62/3.3; 257/930
(58) Field of Search ................................ 136/203, 230, 136/242, 233; 62/3.3; 257/712, 930

(56) References Cited

U.S. PATENT DOCUMENTS

| | | | |
|---|---|---|---|
| 2,844,638 A | * 7/1958 | Lindenblad | 136/4 |
| 3,546,025 A | * 12/1970 | Federick et al. | 136/205 |
| 3,714,539 A | * 1/1973 | Hampl, Jr. | 136/205 |
| 4,983,225 A | 1/1991 | Rowe | 136/201 |
| 5,637,921 A | * 6/1997 | Burward-Hoy | 257/712 |
| 5,712,448 A | 1/1998 | Vandersande et al. | 136/203 |
| 5,956,569 A | 9/1999 | Shiu et al. | 438/48 |
| 6,164,076 A | 12/2000 | Chu et al. | 62/3.7 |

OTHER PUBLICATIONS

Chu et al., pending U.S. patent application entitled "Thermoelectric-Enhanced Heat Spreader For Heat Generating Component Of An Electronic Device", Ser. No. 09/606,984, filed Jun. 29, 2000.

Chu et al., pending U.S. patent application entitled "Thermal Spreader and Interface Assembly for Heat Generating Component Of An Electronic Device", Ser. No. 09/606,619, filed Jun. 29, 2000.

Chu et al., pending U.S. patent application, entitled "Electronic Module With Integrated Programmable Thermoelectric Cooling Assembly and Method of Fabrication", Ser. No. 09/726,909, filed Nov. 30, 2000.

* cited by examiner

Primary Examiner—Nam Nguyen
Assistant Examiner—Thomas H. Parsons
(74) Attorney, Agent, or Firm—Andrew J. Wojnicki, Jr., Esq.; Kevin P. Radigan, Esq.; Heslin Rothenberg Farley & Mesiti P.C.

(57) ABSTRACT

An electronic module is provided having an integrated thermoelectric cooling assembly disposed therein coupled to the module's electronic device. The thermoelectric assembly includes one or more thermoelectric stages and a thermal space transformer, for example, disposed between a first thermoelectric stage and a second thermoelectric stage. The electronic device is mounted to a substrate with the thermoelectric assembly disposed in thermal contact with the electronic device and a thermally conductive cap is positioned over the thermoelectric assembly, and is also in thermal contact with the thermoelectric assembly. Power to the thermoelectric assembly can be provided using electrically conductive springs disposed between one or more stages of the assembly and pads on an upper surface of the substrate, which electrically connect to power planes disposed within the substrate.

9 Claims, 1 Drawing Sheet

ELECTRONIC MODULE WITH INTEGRATED THERMOELECTRIC COOLING ASSEMBLY

CROSS-REFERENCE TO RELATED APPLICATIONS

This application contains subject matter which is related to the subject matter of the following applications, which are assigned to the same Assignee as this application. The below-listed applications are hereby incorporated herein by reference in their entirety:

"ELECTRONIC MODULE WITH INTEGRATED PROGRAMMABLE THERMOELECTRIC COOLING ASSEMBLY AND METHOD OF FABRICATION", by Chu et al., Ser. No. 09/726,909, co-filed herewith;

"THERMOELECTRIC COOLING ASSEMBLY WITH THERMAL SPACE TRANSFORMER INTERPOSED BETWEEN CASCADED THERMOELECTRIC STAGES FOR IMPROVED THERMAL PERFORMANCE", by Chu et al., Ser. No. 09/368,803 (now U.S. Pat. No. 6,164,076), filed Aug. 5, 1999;

"THERMOELECTRIC-ENHANCED HEAT SPREADER FOR HEAT GENERATING COMPONENT FOR AN ELECTRONIC DEVICE," by Chu et al, Ser. No. 09/606,984, filed Jun. 29, 2000 (now U.S. Pat. No. 6,424,533); and "THERMAL SPREADER AND INTERFACE ASSEMBLY FOR HEAT GENERATING COMPONENT OF AN ELECTRONIC DEVICE," by Chu et al., Ser. No. 09/606,619, filed Jun. 29, 2000 (now U.S. Pat. No. 6,396,700).

BACKGROUND OF THE INVENTION

1. Technical Field

The present invention is directed to cooling assemblies and other apparatus used for removing heat from electronic devices. More particularly, the present invention is directed to an electronic module with integrated thermoelectric cooling elements. Even more particularly, this invention is directed to a multi-stage thermoelectric apparatus employing a thermal space transformer which is interposed within an electronic module in thermal contact with a heat generating component thereof, such as an integrated circuit chip.

2. Description of the Related Art

As is well known, as the circuit density of electronic chip devices increases, there is a correspondingly increasing demand for the removal of heat generated by these devices. The increased heat demand arises both because the circuit devices are packed more closely together and because the circuits themselves are operated at increasingly high clock frequencies. Nonetheless, it is also known that runaway thermal conditions and excessive heat generated by chips is a leading cause for failure of chip devices. Furthermore, it is anticipated that the demand for heat removal. for these devices will increase indefinitely. Accordingly, it is seen that there is a large and significant need to provide useful cooling mechanisms for electronic circuit devices.

Thermoelectric cooling elements operate electronically to produce a cooling effect. By passing a direct current through the legs of a thermoelectric device, a temperature difference is produced across the device which is contrary to that which would be expected from Fourier's Law.

At one junction of the thermoelectric element both holes and electrons move away, toward the other junction, as a consequence of the current flow through the junction. Holes move through the p-type material and electrons through the n-type material. To compensate for this loss of charge carriers, additional electrons are raised from the valence band to the conduction band to create new pairs of electrons and holes. Since energy is required to do this, heat is absorbed at this junction. Conversely, as an electron drops into a hole at the other junction, its surplus energy is released in the form of heat. This transfer of thermal energy from the cold junction to the hot junction is known as the Peltier effect.

Use of the Peltier effect permits the surfaces attached to a heat source to be maintained at a temperature below that of a surface attached to a heat sink. What these thermoelectric modules provide is the ability to operate the cold side below the ambient temperature of the cooling medium (air or water) or provide greater heat removal capacity for a given cold plate or component temperature. When direct current is passed through these thermoelectric modules a temperature difference is produced with the result that one side is relatively cooler than the other side. These thermoelectric modules are therefore seen to possess a hot side and a cold side, and provide a mechanism for facilitating the transfer of thermal energy from the cold side of the thermoelectric module to the hot side of the module.

BRIEF SUMMARY OF THE INVENTION

Conventional configurations and positionings of thermoelectric assemblies are nonetheless seen herein to be unnecessarily limiting in terms of the thermal energy which may be transferred and the long term reliability attained. Thus, while the use of thermoelectric devices is seen to provide a means for the solid state cooling of adjacent electrical devices, their efficiency and reliability has been less than optimal.

In addition, as complementary metal oxide semiconductor (CMOS) circuit and process technologies approach scaling limits, it becomes necessary to seek approaches and opportunities to achieve further performance gains. One avenue which is receiving increased attention is the operation of CMOS circuits at lower temperatures. The circuit performance enhancements which may be achieved vary from about 1.1× at a cooling condition of 25° C., to 1.8× at a cooling condition of −200° C. To obtain cooling conditions down to about −50° C. or so, conventional refrigeration technology may be utilized. However, conventional refrigeration systems may be difficult to control for variations in heat load, and may not be responsive enough during transient operating conditions.

Thermoelectric devices, used in conjunction with other module cooling technologies, are known to be able to lower junction temperatures below that which can be achieved by the other module cooling technologies alone. Problems arise, however, when thermoelectric devices are taken down in temperature below the ambient, and in particular, below the environment dew point temperature. Traditionally, thermoelectric devices, which are separate from and attached to an electronic module casing (i.e., cap) are exposed to the system environment. When brought down in temperature below the dew point, condensation forms. This condensation significantly reduces the fatigue life due to corrosion of the solder joints forming the thermoelectric junctions. In fact, the mere presence of oxygen accelerates solder fatigue cracking.

Advantageously, disclosed herein is a means for improving thermoelectric device reliability when used in conjunction with cooling of electronic modules. Specifically, a thermoelectric apparatus is integrated within an electronic module itself so that the thermoelectric apparatus is maintained in a controlled, i.e., oxygen and moisture restricted, environment. Furthermore, by integrating a thermoelectric apparatus into the electronic module, power delivery to the thermoelectric devices can be integrated with the module, thus simplifying system level design, i.e., in comparison with delivering power to externally mounted thermoelectric devices.

To summarize, in one aspect, presented herein is an electronic module which includes an electronic device and a thermoelectric assembly. The thermoelectric assembly is thermally coupled to the electronic device for removing heat generating thereby. A housing surrounds the electronic device and the thermoelectric assembly so that the electronic device and the thermoelectric assembly are sealed from the surrounding environment.

As an enhancement, the thermoelectric assembly can comprise a cascaded thermoelectric cooling assembly with a thermal space transformer interposed between adjacent thermoelectric stages for improved thermal performance. The thermal space transformer provides enhanced spreading of heat being "electronically pumped" from the heat load by a first thermoelectric stage, along with the heat dissipated by the thermoelectric elements of the first stage. This spreading of heat takes place in the plane of the thermal space transformer principally in a direction radially outward from the center of the first stage thermoelectric assembly, i.e., in a direction transverse to the principal heat flow through the first thermoelectric stage. Increased thermal spreading makes it possible to utilize a larger surface area for the second stage encompassing an increased number of thermoelectric couples or elements in the second stage, thereby reducing the amount of heat to be "electronically pumped" by each element. The combined effect of the first and second stage thermoelectric assemblies with the thermal space transformer in between is to accommodate an increased amount of heat to be pumped from the electronic device while maintaining the same temperature difference from the base of the first stage (i.e., Tcold) to the top of the second stage (i.e., Thot), or to allow a greater temperature difference between the two stages for the same heat load (i.e., Tcold).

As a further enhancement, by integrating a cascaded thermoelectric cooling assembly within the electronic module, power delivery to the thermoelectric elements can be simplified by eliminating discrete wiring outside of the module. Wire bond or electrical spring contacts can be employed within the module to couple the thermoelectric stages to appropriate power planes, e.g., disposed within the substrate of the module.

Additional features and advantages are realized through the techniques of the present invention. Other embodiments and aspects of the invention are described in detail herein and are considered part of the claimed invention.

BRIEF DESCRIPTION OF THE DRAWING

The above-described objects, advantages and features of the present invention, as well as others, will be more readily understood from the following detailed description of certain preferred embodiments of the invention, when considered in conjunction with the accompanying drawing in which.

DETAILED DESCRIPTION OF THE INVENTION

Figure 1:
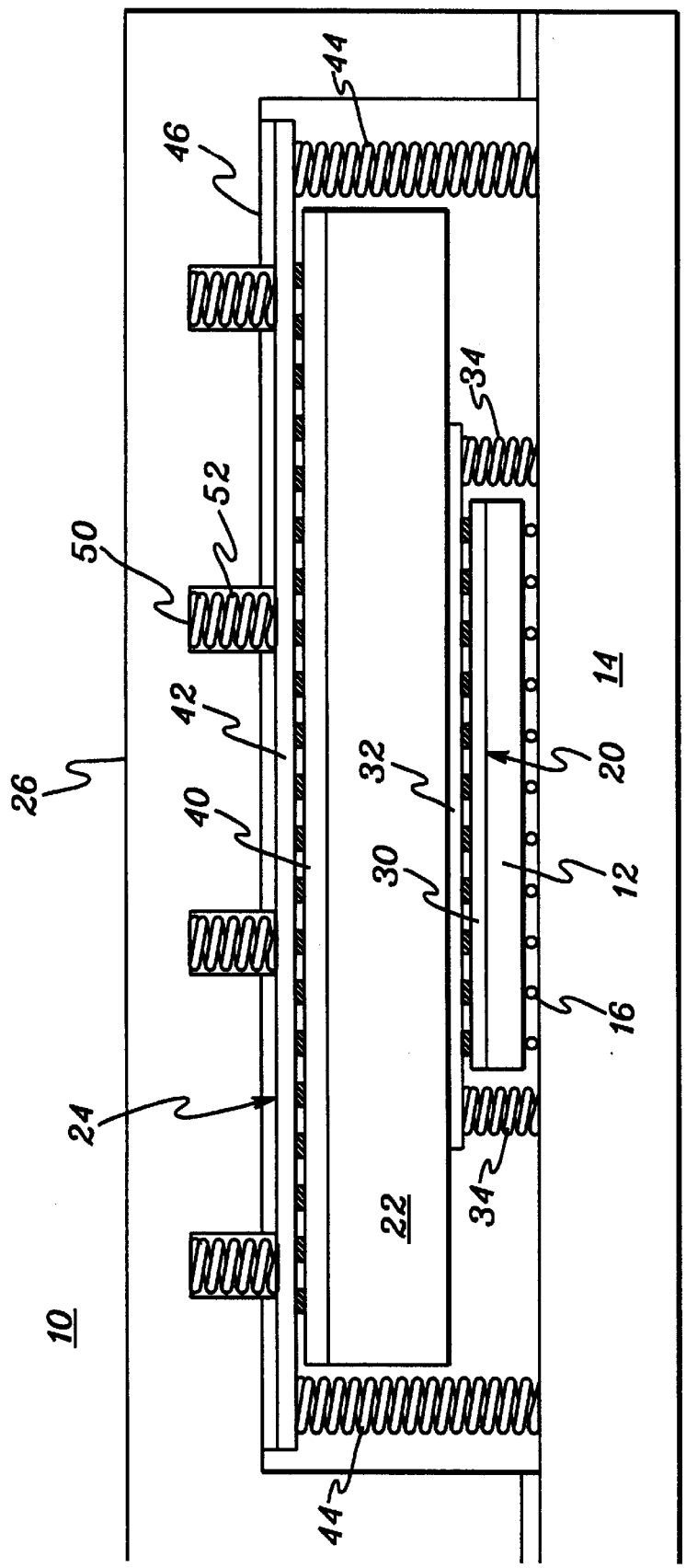
FIG. 1 is a partial elevational view illustrating one embodiment of an electronic module employing an integrated thermoelectric apparatus in accordance with the principles of the present invention.

Generally stated, provided herein is an electronic module with an integrated thermoelectric cooling assembly for removing heat from an electronic device thereof, such as an integrated circuit chip. The thermoelectric cooling assembly and electronic device are sealed together within the module, for example, between a substrate and a thermally conductive cap. In one embodiment, the thermoelectric cooling assembly comprises a multi-stage cooling assembly employing two cascaded thermoelectric stages with a light-weight "thermal space transformer" disposed therebetween to efficiently distribute heat from a first stage to a second stage. The multi-stage thermoelectric cooling assembly can be attached to any heat source, such as an integrated and for maintaining device temperature below an ambient temperature.

In the context of this invention, "cascaded" thermoelectric stages means that two adjacent stages of a multi-stage thermoelectric cooling assembly have different heat dissipating and heat absorption surface areas. Further, a "thermal space transformer" is a structure disposed between two adjacent cascaded thermoelectric stages which facilitates the spreading of heat dissipated from a first stage for more efficient absorption by the second stage, having a larger surface area. Further, the relative size of surface areas of adjacent cascaded thermoelectric stages can be translated into a difference in the number of thermoelectric elements in each of the adjacent stages.

FIG. 1 depicts one embodiment of an electronic module, generally noted 10, in accordance with the principles of the present invention. Module 10 includes an electronic device 12, such as an integrated circuit chip which in this embodiment is mounted on a substrate 14 and is electrically connected to circuitry on or within substrate 14 via conventional metal connects, such as solder bumps 16.

In this embodiment, the thermoelectric cooling assembly includes a first stage 20 of thermoelectric elements or couples and a second stage 24 of thermoelectric elements or couples. As noted above, it is well known that by passing direct current through a series of thermoelectric couples, one side of the thermoelectric will transfer heat to the other side. Essentially, heat is "electronically" pumped from the cold side to the hot side. In the embodiment of FIG. 1, the cold side of the cooling assembly is thermally coupled to an upper surface of electronic device 12, for example, employing an appropriate oil or phase change interface material, such as Chomerics' Thermflow™ T310 material marketed by Parker Hannifin Corporation of Woburn, Mass.

Heat which flows out the hot side of a set of thermoelectric couples will be comprised of the active heat pumped, in addition to the power dissipation of the thermoelectric couples in performing the electronic heat pumping action. The second stage 24 of electronic elements is provided to handle this total heat load. The temperature difference across the two thermoelectric stages 20, 24 will be additive. To provide adequate heat-pumping capability and to maintain a temperature difference across the second stage, the number of thermoelectric elements for the second stage can be greater and occupy a larger surface area than the surface area occupied by the first stage.

In this example,, heat flows through the first thermoelectric stage 20 to the second thermoelectric stage 24 and thereafter to a thermally conductive cap 26, which may be coupled to a cold plate (not shown). Heat is therefore dissipated through a second main surface 32 of thermoelectric stage 20 and absorbed by a first main surface 40 of thermoelectric stage 24 for transfer to cap 26. As used herein, the "second main surface" of first thermoelectric stage 20 and the "first main surface" of second thermoelectric stage 24 comprise surface areas of opposing plates 32 and 40 of the respective stages. In the embodiment depicted, a thermal space transformer 22 is disposed between these opposed surfaces of the cascaded multi-stage thermoelectric cooling assembly.

A cascaded multi-stage thermoelectric cooling assembly with integral thermal space transformer is described in detail in the above-incorporated United States Patent Application entitled, "THERMOELECTRIC COOLING ASSEMBLY WITH THERMAL SPACE TRANSFORMER INTERPOSED BETWEEN CASCADED THERMOELECTRIC STAGES FOR IMPROVED THERMAL PERFORMANCE," Ser. No. 09/368,803 (now U.S. Pat. No. 6,164,076). Briefly summarized, however, thermal space transformer 22 is provided to spread heat leaving the first stage 20 thermoelectric elements and to provide the heat flux entering the second stage 24 thermoelectric elements. The thermal space transformer is placed between the first and second stages, with the hot side of the first stage on one side of the transformer and the cold side of the second stage on the opposite side of the transformer.

To provide a low weight transformer, with high thermal conductivity parallel to the mounting planes of the thermoelectric elements, a graphite composition material may be employed. Various specific embodiments of the thermal space transformer are described in the above-incorporated application. For the purposes of this application, transformer 22 has two planar main surfaces which are deemed to extend in a planar x-y axis direction. Transformer 22 also has a thickness extending in the z-axis plane. When disposed within a thermoelectric cooling assembly in accordance with this invention, the planar main (x-y axis) surfaces are transverse to a direction of heat flow between the thermal couples of the first stage and the second stage, and are thereby substantially parallel to the second surface area of the first stage and the first surface area of the second stage. The thickness of transformer 22 extends in the z-axis direction and is parallel to the direction of heat flow between the first stage and the second stage of the thermoelectric cooling assembly.

In accordance with one aspect of the present invention, thermal conductivity of transformer 22 in the x-y direction ($K_{x-y}$) is preferably greater than thermal conductivity of the transformer in the z-axis direction ($K_z$). This allows heat dissipated from the first stage to more readily spread out through the transformer to all thermoelectric elements of the second stage. For example, thermal conductivity $K_{x-y}$ in the x-y axis plane may be in the range of 400–800 watts/meter Kelvin (W/mK), while thermal conductivity $K_z$ in the z-axis direction may be less than 100 W/mK.

Note that although a thermoelectric cooling assembly in accordance with the present invention is described herein in the context of a two-stage thermoelectric cooling assembly, with a single thermal space transformer, the contents presented can be readily extended to multi-stage assemblies having more than two stages. In such a case, multiple thermal space transformers might be employed, with each thermal space transformer being disposed between a different pair of adjacent, cascaded thermoelectric stages. Alternatively, a single stage may be employed with a single space transformer.

In FIG. 1, a thermal paste 46 is employed at the interface between the second thermoelectric device 24 and thermally conductive cap 26. If first thermoelectric stage 20 has a silicon substrate, a solder or epoxy interface could be formed between electronic device 12 and first thermoelectric stage 20 as well to improve thermal performance without increasing the likelihood of fatigue cracking due to a perfect coefficient of thermal expansion match (i.e., zero mismatch) between the structures.

Electrical power can be provided to the integrated thermoelectric cooling assembly by employing power lines (not shown) conventionally disposed within substrate 14. For example, lands can be provided on the upper surface of substrate 14 which are tied electrically to power and ground planes within the substrate. The first thermoelectric stage 20 can comprise a thin film thermoelectric device having a first plate 30 and a second plate 32 between which the thermoelectric elements are formed. In this embodiment, support plate 32 is shown to have a larger surface area so as to extend beyond the perimeter of first plate 30, and electronic device 12. This allows electrical connection to be made between lands on the upper surface of substrate 14 and contact pads of appropriate wiring metallurgy on the downward facing surface of support plate 32. In this manner, electrical connection between first thermoelectric stage 20 and power planes within substrate 14 can be accomplished. In the embodiment shown, the electrical connection is made by electrically conductive springs 34, which may be soldered or simply compression fitted between the wiring of the first thermoelectric stage and the substrate to ensure good electrical connection therebetween. Alternatively, wire bond contacts could be made between the thermoelectric device and the substrate if desired. Similarly, second thermoelectric device 24 comprises in one embodiment a thin film thermoelectric device having a first support plate 40 and a second support plate 42 between which the thermoelectric elements are disposed. In this embodiment, second support plate 42 is shown to have a larger surface area than the first support plate 40 and could therefore accommodate appropriate wiring metallurgy to allow electrical connection between the second thermoelectric device 24 and lands on the upper surface of substrate 14. The electrically conductive springs 44 are again shown to make this connection. However, wire bond contacts could also be employed.

Assuming that electrical contact springs 34 & 44 are used, then good thermal contact between electronic device 12, first stage thermoelectric 20, thermal spreader 22, and second stage thermoelectric 24 can be maintained by disposing mechanical springs located between cap 26 and the second thermoelectric stage. In the embodiment of FIG. 1, these springs 52 are shown disposed within recesses 50 formed within cap 26. Preferably, the forces between springs 34 & 44 pushing up and compressive forces of springs 52 pushing down at least balance. Alternatively, springs 52 can apply a slightly greater force to ensure good thermal contact between electronic device 12 and the thermoelectric cooling assembly.

Operationally, heat generated by the electronic device, plus power dissipated by the first thermoelectric stage is transformed from the chip surface area to the cap surface area via the thermal spreader. This heat plus the power dissipated from the second thermoelectric stage is conducted across a thermal interface, into the cap, and out the module heat removal surface, for example, the upper surface of the cap. The thermal spreader geometry and thermal conductivity are chosen to optimize the transfer of heat from the (smaller) electronic device area to the (larger) electronic module area. Thin film thermoelectric devices are advantageous for their low profile and their thermal performance.

If desired, a microprocessor cooling system controller could monitor the electronic module temperature via a thermistor, for example, mounted within the module housing. A thermistor sense line would be fed back to the cooling system controller. If the module temperature changes, the controller can then provide a signal to a dc power controller to increase or decrease electric current to the thermoelectric cooling assembly as required to quickly return the heat source to a set point condition or range.

Advantageously, by disposing a thermoelectric cooling assembly within the electronic module itself, the electronic device and cooling assembly are maintained in a controlled, i.e., oxygen and moisture free environment. Furthermore, power delivery to the thermoelectric devices is also integrated within the module thus simplifying system level design, i.e., in comparison with power delivery to externally mounted thermoelectric devices.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. An electronic module comprising:

an electronic device;

a thermoelectric assembly thermally coupled to said electronic device for removing heat generated thereby;

a housing surrounding said electronic device and said thermoelectric assembly, said housing sealing said electronic device and thermoelectric assembly from the ambient environment;

wherein said thermoelectric assembly comprises a multi-stage thermoelectric apparatus;

wherein said multi-stage thermoelectric apparatus comprises a thermal space transformer disposed between adjacent thermoelectric stages;

wherein said multi-stage thermoelectric apparatus comprises:

a first thermoelectric stage thermally coupled to said electronic device, said first thermoelectric stage having a first surface area for thermal dissipation;

a second thermoelectric stage, said second thermoelectric stage having a second surface area for thermal absorption, wherein said second surface area is greater than said first surface area;

wherein said thermal space transformer is disposed between said first thermoelectric stage and said second thermoelectric stage, and thermally couples said first thermoelectric stage to said second thermoelectric stage; and wherein said thermal space transformer has a first thermal conductivity in an x-y axis plane transverse to a direction of primary heat flow through said first thermoelectric stage and said second thermoelectric stage, and a second thermal conductivity in a z axis direction parallel to said direction of primary heat flow through said first thermoelectric stage and said second thermoelectric stage, and wherein said first thermal conductivity is greater than said second thermal conductivity.

2. An electronic module comprising:

an electronic device;

a thermoelectric assembly thermally coupled to said electronic device for removing heat generated thereby;

a housing surrounding said electronic device and said thermoelectric assembly, said housing sealing said electronic device and thermoelectric assembly from the ambient environment;

wherein said housing comprises a substrate and a cap, and wherein said thermoelectric module further comprises an operative electrical connection of said thermoelectric assembly to power planes disposed on or within said substrate; and wherein said operative electrical connection comprises electrically conductive springs disposed between said thermoelectric assembly and said substrate.

3. The electronic module of claim 2, wherein said thermoelectric assembly comprises a multi-stage thermoelectric apparatus, and wherein said conductive springs are disposed between a first thermoelectric stage of said apparatus and said substrate, and between a second thermoelectric stage of said apparatus and said substrate to electrically couple said first thermoelectric stage and said second thermoelectric stage to said power planes disposed on or within said substrate.

4. The electronic module of claim 3, wherein said first thermoelectric,stage comprises a first support plane and a second support plane, wherein said first support plane is thermally coupled to said electronic device and said second support plane is in opposing relation to a first support plane of said second thermoelectric stage, wherein said first support plane of said first thermoelectric stage has a smaller surface area than said second support plane of said first thermoelectric stage, and wherein said second thermoelectric stage comprises said first support plane and a second support plane, and wherein said first support plane of said second thermoelectric stage has a smaller surface area than said second support plane of said second thermoelectric stage, and wherein said electrically conductive springs are disposed between said second support plane of said first thermoelectric stage and said substrate, and between said second support plane of said second thermoelectric stage and said substrate.

5. The electronic module of claim 2, further comprising compression springs disposed between said thermoelectric assembly and said cap, wherein said compression springs exert a total compressive force at least equal to a compressive force exerted by said electrically conductive springs, and wherein compressive forces of said electrically conductive springs and said compression springs are in opposing relation.

6. The electronic module of claim 5, wherein said compression springs ensure thermal coupling between said electronic device and said multi-stage thermoelectric apparatus.

7. The electronic module of claim 2, wherein said electronic device comprises an integrated circuit chip.

8. The electronic module of claim 2, wherein said thermoelectric assembly comprises a thermal space transformer positioned to facilitate heat dissipation from said electronic device to said housing.

9. An electronic module comprising:

an electronic device;

a thermoelectric assembly thermally coupled to said electronic device for removing heat generated thereby;

a housing surrounding said electronic device and said thermoelectric assembly, said housing sealing said electronic device and thermoelectric assembly from the ambient environment;

wherein said thermoelectric assembly comprises a thermal space transformer positioned to facilitate heat dissipation from said electronic device to said housing; and wherein said housing comprises a substrate and a thermally conductive cap, and wherein said electronic device is mounted to said substrate and said thermoelectric assembly is disposed between said electronic device and said thermally conductive cap, and wherein said thermal space transformer has a first thermal conductivity in an x-y axis plane transverse to a direction of primary heat flow through said thermoelectric assembly, and a second thermal conductivity in a z-axis direction parallel to said direction of primary heat flow through said thermoelectric assembly, and wherein said first thermal conductivity is greater than said second thermal conductivity.

* * * * *